(12) United States Patent
Meacham, II

(10) Patent No.: US 11,234,075 B2
(45) Date of Patent: Jan. 25, 2022

(54) SPEAKER EXCURSION PREDICTION AND PROTECTION

(71) Applicant: SEMICONDUCTOR COMPONENTS INDUSTRIES, LLC, Phoenix, AZ (US)

(72) Inventor: James A. Meacham, II, Gorham, ME (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/247,156

(22) Filed: Dec. 2, 2020

(65) Prior Publication Data

US 2021/0258688 A1    Aug. 19, 2021

Related U.S. Application Data

(63) Continuation of application No. 16/785,968, filed on Feb. 10, 2020, now Pat. No. 10,893,359.

(51) Int. Cl.
   *H04R 3/00* (2006.01)
   *H04R 29/00* (2006.01)
   *H03F 3/181* (2006.01)
   *H04R 3/04* (2006.01)

(52) U.S. Cl.
   CPC ............. *H04R 3/007* (2013.01); *H03F 3/181* (2013.01); *H04R 3/04* (2013.01); *H04R 29/001* (2013.01); *H03F 2200/03* (2013.01)

(58) Field of Classification Search
   CPC ........ H04R 3/007; H04R 3/04; H04R 29/001; H03F 3/181; H03F 2200/03
   See application file for complete search history.

(56) References Cited

U.S. PATENT DOCUMENTS

| | | |
|---|---|---|
| 2012/0281844 A1 | 11/2012 | Luo et al. |
| 2013/0077795 A1 | 3/2013 | Risbo et al. |
| 2015/0086025 A1 | 3/2015 | Oyetunji |
| 2015/0124982 A1* | 5/2015 | Berthelsen ........... H04R 29/001 381/59 |
| 2016/0173983 A1 | 6/2016 | Berthelsen et al. |
| 2018/0160227 A1 | 6/2018 | Lawrence et al. |
| 2019/0124444 A1* | 4/2019 | Lawrence ................ H04R 3/04 |

OTHER PUBLICATIONS

U.S. Appl. No. 16/785,968, filed Feb. 10, 2020, Allowed.

* cited by examiner

*Primary Examiner* — Andrew L Sniezek
(74) *Attorney, Agent, or Firm* — Brake Hughes Bellerman LLP

(57) ABSTRACT

Systems and devices configured by an algorithm to prevent or limit a speaker over-excursion are disclosed. The disclosed algorithm is computationally efficient because it exploits a relationship between an audio signal and a speaker's excursion that exists at low-frequencies, below a self-resonance of a speaker. The disclosed algorithm combines the low-frequency excursion protection with a high-frequency, transient excursion protection. The combined approach allows the transient excursion protection to use a shorter delay than otherwise possible. The shorter delay allows for a compressor to apply attenuation to a transient audio signal before a momentum of the speaker, caused by the transient audio signal, grows too large to be controlled.

20 Claims, 7 Drawing Sheets

SPEAKER EXCURSION PREDICTION AND PROTECTION

CROSS-REFERENCE TO RELATED APPLICATION

This application is a continuation of U.S. application Ser. No. 16/785,968 filed on Feb. 10, 2020, which is hereby incorporated by reference in its entirety.

FIELD OF THE DISCLOSURE

The present disclosure relates to audio systems and more specifically to systems and methods for protecting a speaker from excessive movement (i.e., over excursion).

BACKGROUND

Audio speakers (i.e., speakers) are designed to operate below a maximum excursion. It may be possible (e.g., through amplification or signal processing) to drive a speaker to move in excess of its maximum excursion. This excess movement can result in damage to, or destruction of, the speaker. For example, a coil of a speaker may be driven to an unguided position, at which point it may become permanently lodged. Additionally, a suspension which supports a speaker cone may become permanently stretched so that sounds from the speaker are distorted. The excess movement can also result in a degradation of a sound quality or unwanted sounds from the speaker. Accordingly, it may be desirable to protect a speaker from over excursion. It is in this context that implementations of the disclosure arise.

SUMMARY

In at least one aspect, the present disclosure generally describes a computing device. The computing device includes a speaker that is configured to move according to an audio signal. The computing device also includes a processor that is configured by software instructions to perform a method to limit movements of the speaker to below a maximum excursion. The method includes receiving the audio signal. The method further includes applying a low-frequency excursion protection to the audio signal. The low-frequency excursion protection includes determining a sub-resonance excursion prediction of a movement of the speaker, comparing the sub-resonance excursion prediction to the maximum excursion, and adjusting the audio signal when the sub-resonance excursion prediction exceeds the maximum excursion. After the low-frequency excursion protection is applied, a transient excursion protection is applied to the audio signal. The transient excursion protection includes determining an instantaneous excursion prediction of the movement of the speaker, comparing the instantaneous excursion prediction to the maximum excursion, and adjusting the audio signal when the instantaneous excursion prediction exceeds the maximum excursion.

In at least one other aspect, the present disclosure generally describes a method to limit a movement of a speaker to below a maximum excursion. The method includes receiving an audio signal. The method further includes applying a low-frequency protection to the audio signal, which includes determining a sub-resonance excursion prediction of the movement of the speaker, comparing the sub-resonance excursion prediction to the maximum excursion, and adjusting the audio signal when the sub-resonance excursion prediction exceeds the maximum excursion. After applying the low-frequency excursion protection of the audio signal, the method includes applying a transient excursion protection to the audio signal. The transient excursion protection includes determining an instantaneous excursion prediction of the movement of the speaker, comparing the instantaneous excursion prediction to the maximum excursion, and adjusting the audio signal when the instantaneous excursion prediction exceeds the maximum excursion.

In at least one other aspect, the present disclosure generally describes a smart amplifier. The smart amplifier includes a processor that is configured by software instructions to perform a method. The method includes receiving an audio signal and receiving a sensed signal. The sensed signal corresponds to a response (i.e., an audio signal response) of a speaker that is coupled to the smart amplifier. The method further includes deriving speaker parameters from the sensed signal and updating at least one speaker model based on the derived speaker parameters. The method further includes applying a low-frequency excursion protection to the audio signal. The low-frequency excursion protection includes determining a sub-resonance excursion prediction of a movement of the speaker that is based on the updated at least one speaker model, comparing the sub-resonance excursion prediction to a maximum excursion, and adjusting the audio signal when the sub-resonance excursion prediction exceeds the maximum excursion to limit movements of the speaker to below a maximum excursion. After applying the low-frequency excursion protection, the method includes applying a transient excursion protection to the audio signal. The transient excursion protection includes determining an instantaneous prediction of the movement of the speaker that is based on the updated at least one speaker model, comparing the instantaneous prediction to the maximum excursion and adjusting the audio signal when the instantaneous prediction exceeds the maximum excursion to limit movements of the speaker to below the maximum excursion.

The foregoing illustrative summary, as well as other exemplary objectives and/or advantages of the disclosure, and the manner in which the same are accomplished, are further explained within the following detailed description and its accompanying drawings.

DETAILED DESCRIPTION

The present disclosure describes systems and methods for adaptively adjusting an audio signal to prevent damage to or distortion of sounds from a speaker as a result of excessive (i.e. over) excursion. The disclosed approach combines low-frequency excursion protection with transient excursion protection (e.g., high-frequency excursion protection). For the low-frequency excursion protection, the approach utilizes a simplification for determining an excursion based on an analysis of sub-resonance frequencies of an audio signal. The disclosed systems and methods may provide the advantageous results of excursion protection without significant audio distortion and with low computational complexity (i.e., high computational efficiency). The low computational complexity can make the disclosed approach especially useful in mobile computing devices (e.g., mobile phones, tablet computers), which are typically battery operated and which tend to have small speakers that can easily be over-driven into excessive excursion. Additionally, the low-frequency excursion protection and the transient excursion protection combine in a way that can limit a delay caused by the excursion protection. Accordingly, the disclosed systems and methods may not significantly affect an audio signal that does not require excursion protection.

The disclosed circuits and methods may be used in a variety of systems including but not limited to smart speakers (e.g., voice-activated virtual assistant), mobile devices (e.g., mobile phones, tablets), audio processors (e.g., digital mixing board), and smart amplifiers (e.g., integrated amplifier circuit). The disclosed circuits and methods may be implemented in a digital portion of an audio processing stream before the audio is converted to an analog audio signal and transmitted to a speaker.

Figure 1:
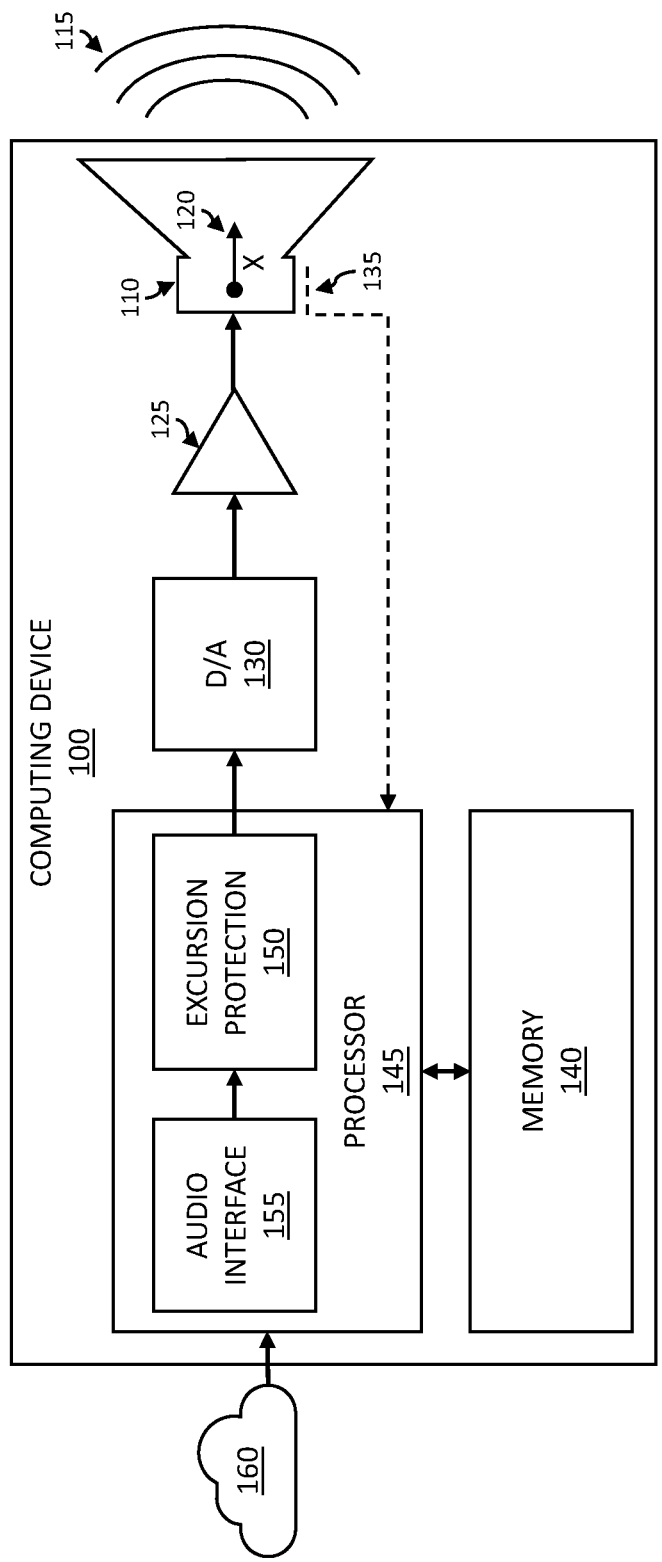
FIG. 1 illustrates a block diagram of a computing device configured for audio playback with excursion protection according to a possible implementation of the present disclosure.

FIG. 1 illustrates a block diagram of a computing device configured for audio playback with excursion protection according to a possible implementation of the present disclosure. The computing device 100 includes a speaker 110. The speaker may be of a variety of types and materials that are configured to convert an electrical, analog audio signal into a corresponding sound wave 115. The speaker 110 may include a voice coil (i.e., coil) positioned within a magnetic field created by a magnet so that a current in the coil and the magnetic field can produce a physical force that can move (displace) a diaphragm (e.g., cone) of the speaker by an excursion amount determined by the audio signal. The speaker includes a suspension that supports the diaphragm and provides returning force to counter an excursion 120 (i.e., displacement) of the speaker 110.

The computing device 100 may also include an amplifier 125 (e.g., power amplifier) and a digital-to-analog (D/A) converter 130 that together transform a digital audio signal to an analog audio signal at an appropriate level to drive the speaker. When the speaker is driven with an audio signal having an amplitude above an appropriate level (i.e., when the speaker is over-driven), however, an excursion 120 of the speaker 110 may exceed a maximum excursion specified for the speaker 110 and damage or change to the speaker 110 may result.

A speaker can be over-driven beyond its designed maximum excursion (i.e., excursion limit) by a variety of sources. Some sources are intentional. For example, an audio signal may be processed to enhance a bass response, thereby creating low-frequency components which are beyond a capability of a speaker (e.g., a small, multipurpose speaker). Some sources are unintentional. For example, a transient signal may create a high-amplitude, short-duration (i.e., impulse) signal that can move a speaker more than, for example, semi-steady tones created by music or speech. The movement resulting from over-driving the speaker may exceed a maximum excursion by an over-excursion amount (i.e., an over-excursion). Excursion protection of the speaker may require an adjustment to the audio signal that is in proportion to the over-excursion.

In some implementations, the computing device may further include a sensor 135 proximate to, or integrated with, the speaker. In one possible implementation, the sensor 135 can be configured to generate a sensed signal corresponding to a position and/or a movement (e.g., velocity, acceleration) of the speaker. In another possible implementation, the sensor 135 can be configured to generate a sensed signal corresponding to a voltage (e.g., a driving voltage) or a current (e.g., driving current) of the speaker. The voltage/current measurements can be digitized and fed back to the processor. The sensed signal may be used to determine (i.e., derive) speaker parameters that describe (i.e. model) the operation of the speaker. Accordingly, in some implementations it is possible to update (e.g., periodically update) a speaker model to account for physical changes to the environment and/or the speaker. Possible speaker parameters than can be used to model the speaker are shown in TABLE 1.

TABLE 1

EXAMPLE SPEAKER PARAMETERS

| SPEAKER PARAMETER | SYMBOL | UNIT |
|---|---|---|
| Diaphragm Mass | $M_{ms}$ | g |
| Suspension Stiffness | $K_{ms}$ | N/m |
| Mechanical Resistance of Suspension | $R_{ms}$ | N · s/m |
| Direct Current (DC) Resistance of Coil | $R_e$ | Ω |
| Force Factor of Magnetic Field on Coil | Bl | T · m |
| Resonant Frequency | $F_s$ | Hz |

The computing device 100 may also include a memory 140. For example, the computing device may include a non-transitory computer readable memory, which stores computer-readable instructions that when executed by a processor 145 can cause the processor (and the computing device more generally) to perform a method, such as a method for excursion protection 150 or a method for interfacing with an audio source (i.e., audio interface 155).

In some implementations, the audio interface 155 may be configured to receive or retrieve audio data from an audio source (e.g., a file, a bit stream, a device, etc.). For example, the audio interface 155 may retrieve audio data from the memory 140 or from a network 160, which wired or wirelessly, can couple audio sources to the computing device 100. The audio interface 155 may further translate the received audio into a digital audio signal (i.e., audio signal).

The memory may also include a speaker model that describes the operation of the speaker. For example, the speaker model may define a displacement (X) of the speaker based on an input audio signal using, for example, one or more of the speaker parameters listed in TABLE 1. The memory may also include audio files, which can be stored in a variety of digital audio formats. In a possible implementation, the audio interface 155 may retrieve an audio file from the memory and transform the audio file into the audio signal.

The memory may also include software instructions, modules, programs and the like. For example, the memory may include computer-readable instructions that when executed by the processor perform a method for limiting a movement of a speaker to below a maximum excursion. When configured, the processor can analyze aspects of the audio signal to predict an excursion of the speaker and adjust the audio signal when the predicted excursion is determined to exceed a (predetermined) maximum excursion. The disclosed approach can provide this analysis/adjustment without significantly affecting (e.g., delaying) an audio data stream and so it can be combined with another forms of excursion protection and/or audio processing.

Figure 2:
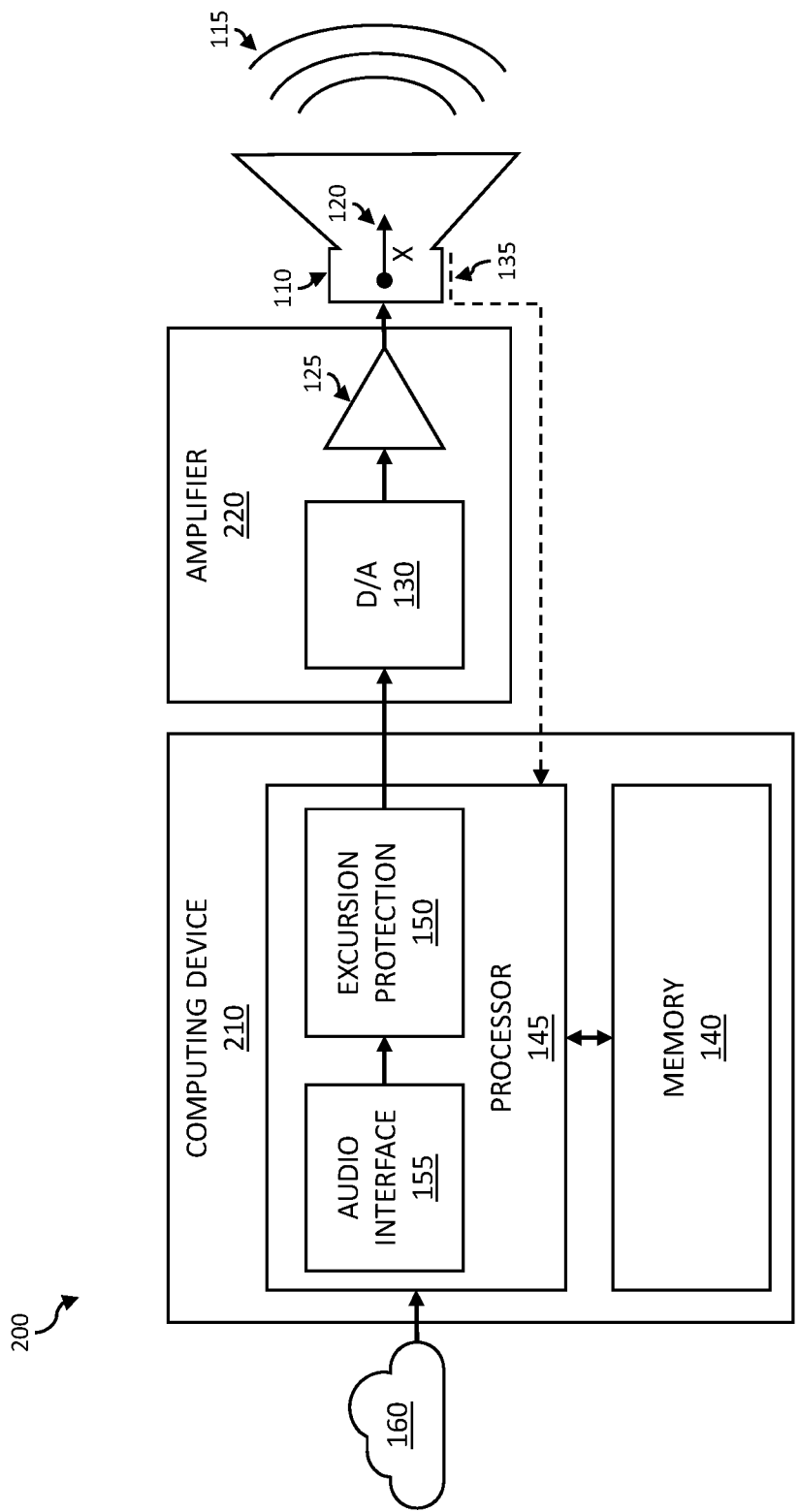
FIG. 2 illustrates a block diagram of an audio system with excursion protection according to a possible implementation of the present disclosure.
Figure 3:
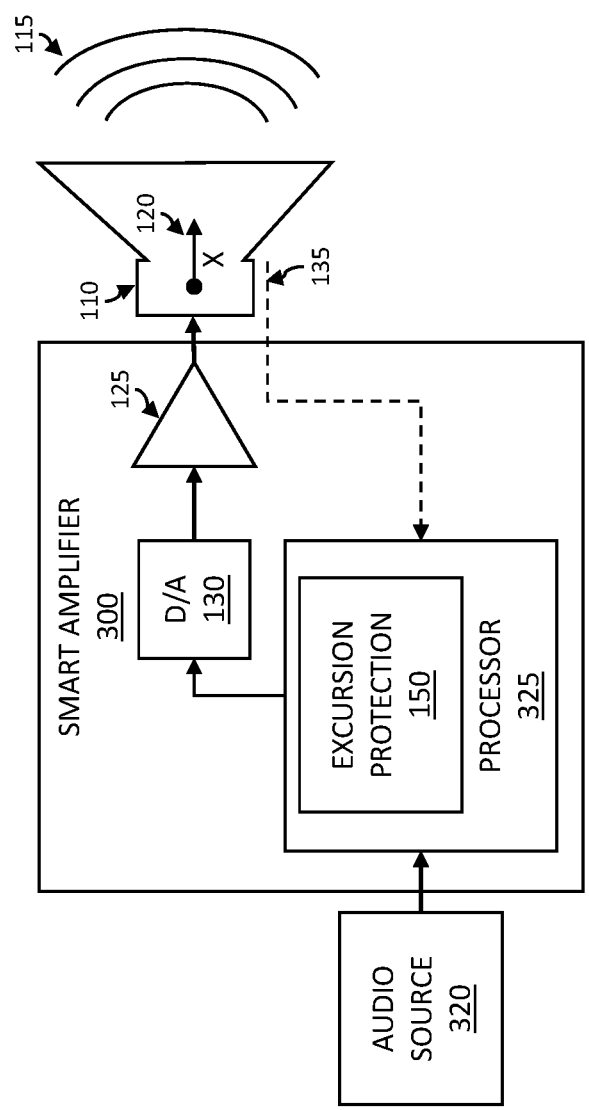
FIG. 3 illustrates a block diagram of a smart amplifier configured to amplify and audio signal with excursion protection according to a possible implementation of the present disclosure.

The computing device configured for audio playback with excursion protection shown in FIG. 1 is completely integrated, including both digital and analog portions of audio playback. The disclosed approach may be implemented in a variety of other hardware configurations, such as shown in FIGS. 2 and 3. The various implementations shown in these figures represent a range of possible implementations, which can include various combinations and/or sub-combinations of the functions, components and/or features of the different implementations. For example, FIG. 2 illustrates a block diagram of an audio system with excursion protection according to a possible implementation of the present disclosure. The system 200 includes a computing device 210, an amplifier 220 and a speaker 110 that are physically distinct but communicatively coupled. In a possible implementation the system 200 may include a plurality of speakers.

In another example, FIG. 3 illustrates a block diagram of a smart amplifier configured to amplify and audio signal with excursion protection according to a possible implementation of the present disclosure. The smart amplifier 300 is configured to couple an audio source 320 to a speaker 110. In some implementations, the smart amplifier can be configured to receive (e.g., via an analog to digital converter) a sensed signal from the speaker. The sensed signal can correspond to a response of the speaker to the audio signal (e.g., a position or a movement) and/or a signal associated with the speaker (e.g., a voltage or a current). A processor 325 (e.g., a digital signal processor (DSP)) of the smart amplifier 300 can be configured to derive speaker parameters (e.g., as shown in TABLE 1) from the sensed signal. In a possible implementation, the derived speaker parameters may be used to update a speaker model.

A speaker model can be implemented as a mathematical relationship (e.g., equation) between a position/displacement of the speaker (X) and an input audio signal (e.g., $V_{IN}$). In other words, a speaker model may be used to predict a position (i.e., excursion) of the speaker for a given input audio signal (i.e. audio signal).

A speaker responds to an audio signal differently based on the audio signal's frequency content (i.e., spectrum). Like a mass and spring, the speaker may exhibit a resonant frequency (i.e., resonance, self-resonance) at which it most readily responds to an input. Accordingly, the speaker may respond to input signals at frequencies below the resonant frequency ($F_s$) of the speaker differently than input signals at frequencies above the resonant frequency of the speaker.

For an input audio signal below the resonant frequency, the speaker moves in phase and in proportion with the input audio signal (i.e. $V_{IN}$), thereby simplifying the speaker model for sub-resonance (i.e., sub-resonant) frequencies, as shown below.

$$X(n) = C \cdot V_{in}(n) \quad (1)$$

For equation (1) above, X is speaker displacement, $V_{in}$ is audio signal, n is a sample, and C is a constant of proportionality. In some implementations, C may be described by speaker parameters, as shown below.

$$C = \frac{Bl^2}{R_e \cdot K_{ms}} \quad (2)$$

Thus, for low-frequency audio signals predicting an excursion may be made simple by the speaker model for sub-resonance frequency audio signals. Accordingly, the disclosed approach, utilizes the simplification in a sub-resonance excursion prediction to apply low-frequency excursion protection in a computationally efficient manner. This approach may be advantageous because over-excursion may be easily caused by sub-resonance (e.g., bass) frequencies.

Over-excursion may also be easily caused by transient signals (e.g., pops, static, etc.) and low-frequency excursion protection may fail to predict and adjust for these transient signals. Accordingly, the disclosed approach combines a low-frequency excursion protection with a transient excursion protection.

Figure 4:
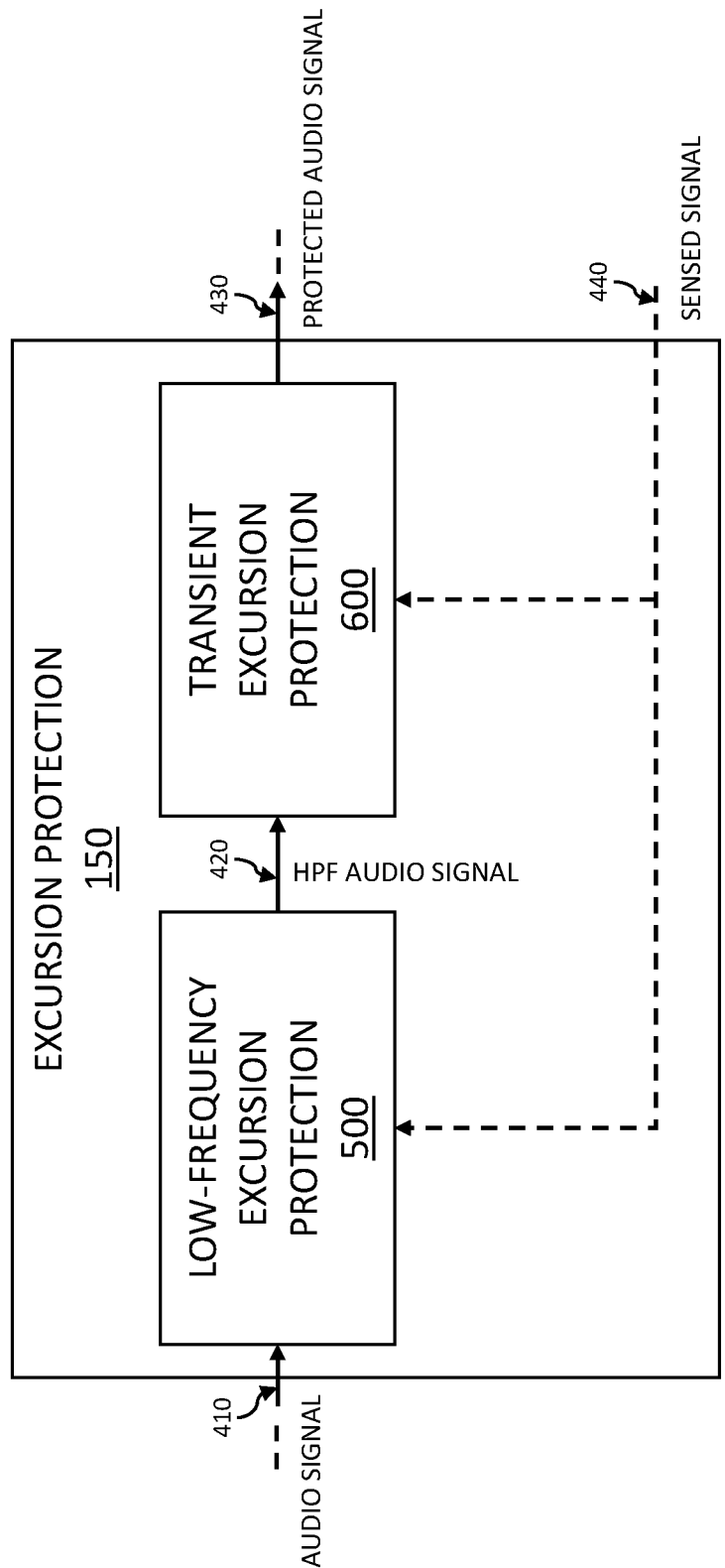
FIG. 4 illustrates a block diagram of an excursion protection module according to a possible implementation of the present disclosure.

FIG. 4 illustrates a block diagram of an excursion protection module (i.e., excursion protection) according to a possible implementation of the present disclosure. The excursion protection 150 includes a low-frequency excursion protection 500 component and a transient excursion protection 600 component. The excursion protection 150 is configured to receive an input audio signal 410 (i.e. audio signal 410) at an input to the low-frequency excursion protection 500. The low-frequency excursion protection 500 is configured to adjust the audio signal 410 and return at its output a high-pass filtered (HPF) version of the audio signal (i.e., HPF audio signal 420). The HPF audio signal 420 is then input to the transient excursion protection 600. The transient excursion protection 600 is configured to adjust the HPF audio signal and return, at its output, an audio signal that protects the speaker from over excursion (i.e., a protected audio signal 430). In some implementations, the excursion protection may be configured to receive a sensed signal 440 (e.g., from a speaker sensor) that can be used, for example, to update the low-frequency excursion protection 500 and/or the transient excursion protection 600 to changes in the speaker.

Figure 5:
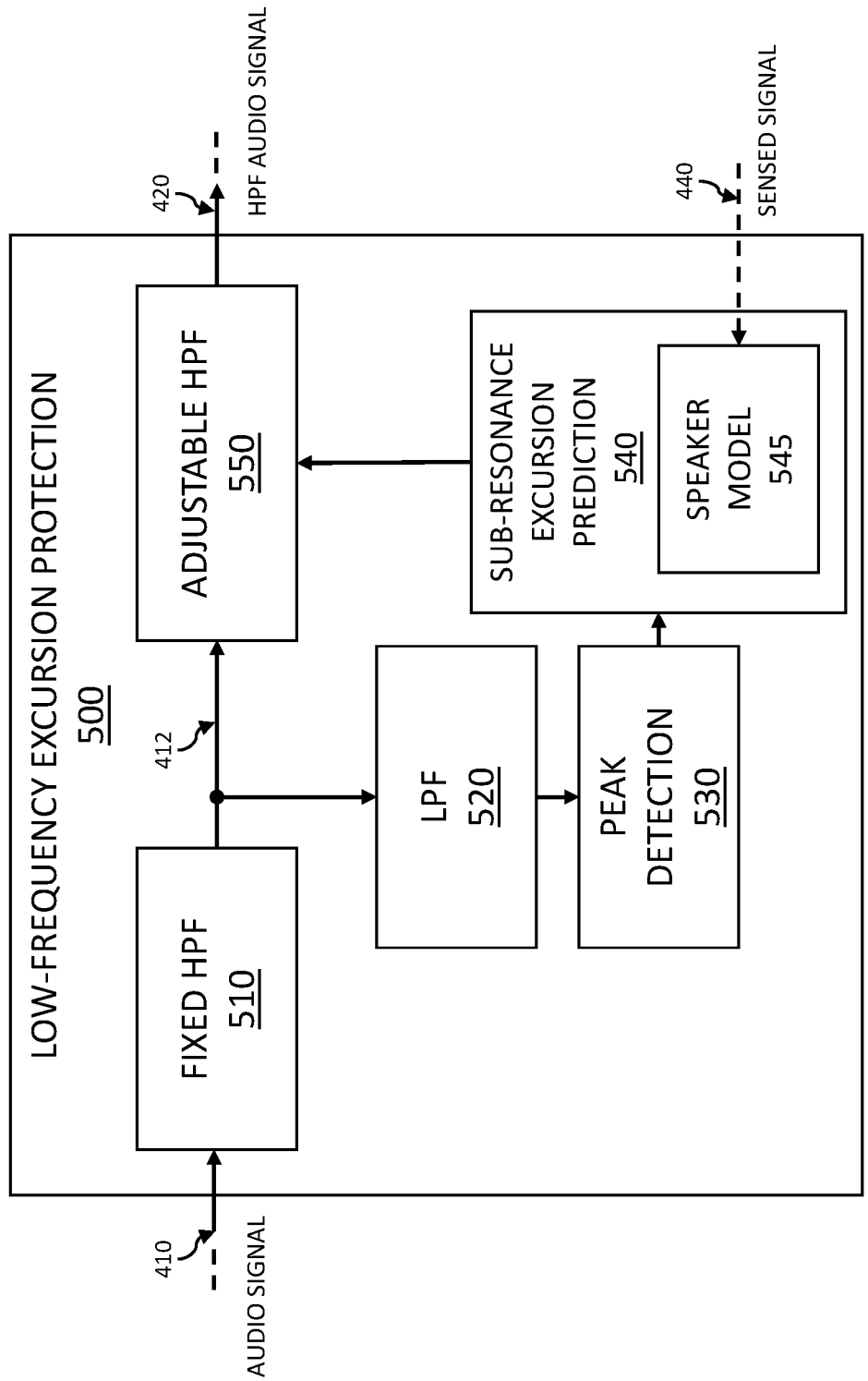
FIG. 5 illustrates a block diagram of a low-frequency excursion protection component of the excursion protection implementation shown in FIG. 4.

FIG. 5 illustrates a block diagram of a low-frequency excursion protection component of the excursion protection implementation shown in FIG. 4. The low-frequency excursion protection 500 includes a fixed high-pass filter 510. The fixed high-pass filter (HPF) is configured to pass frequencies of the audio signal 410 that are above a fixed-cutoff frequency ($F_{c\_fix}$). In a possible implementation, the fixed-cutoff frequency is below the resonant frequency of the speaker (Fs). For example, the fixed-cutoff frequency may be ¼ the resonance frequency of the speaker, such as shown below.

$$F_{c\_fix} = \frac{1}{4} \cdot F_s \quad (3)$$

The frequencies blocked by the fixed high-pass filter 510 may have minimal effect on the protected audio signal 420 because the speaker may have very little (if any) sensitivity for (i.e., response to) the blocked frequency components.

The low-frequency excursion protection 500 further includes an adjustable-high-pass filter 550. The adjustable-high-pass filter 550 is configured to pass frequencies of a filtered audio signal 412 above an adjustable-cutoff frequency ($F_{c\_adj}$). In a normal (i.e., default) state (i.e., when exclusion protection is unnecessary), the adjustable-cutoff frequency may be equal to the fixed-cutoff frequency so that the HPF audio signal 420 is perceived as approximately equivalent to the audio signal 410 when played on the speaker 110. For example, a speaker may have a similar (e.g., the same) response to the HPF audio signal 420 and the audio signal 410 when $F_{c\_fix}=F_{c\_adj}=1/4F_s$.

Low-frequency excursion protection may be accomplished by adjusting (e.g., raising) the adjustable-cutoff frequency so that additional low frequency components (above $1/4F_s$) of the audio signal are blocked. In a possible implementation, the adjustable-cutoff frequency is adjustable over the range shown below.

$$F_{c\_adj} \geq \frac{1}{4} \cdot F_s \qquad (4)$$

The amount of adjustment can depend on a prediction of an excursion that results from sub-resonance frequencies of the audio signal 410 that cause a significant response in the speaker.

The low-frequency excursion protection 500 includes a low-pass filter 520 (LPF). The low-pass filter is configured to pass frequencies of the audio signal 410 that are below a low-pass-cutoff frequency ($F_{c\_lp}$). In other words, the low-pas filter passes a low-pass filtered version of the audio signal. In a possible implementation, the low-pass-cutoff frequency is the resonant frequency of the speaker ($F_s$), such as shown below.

$$F_{c\_lp}=F_s \qquad (5)$$

After passing through the fixed high-pass filter 510 and the low-pass filter 520, the audio signal can contain only frequency components that are at and below the resonance frequency of the speaker. As described above, for audio signals in this frequency regime, the speaker excursion can be predicted by a speaker model 545 in which the excursion is proportional to the audio signal (e.g., see Equation (1)), and in which the speaker parameters of the model are pre-measured (e.g., factory set) or measured on-line (e.g., from a sensor). Accordingly, the low-frequency excursion protection 500 includes peak detection 530 which is applied to the speaker model 545 to predict an excursion (i.e., a movement) of the speaker due to sub-resonance frequencies (i.e., sub-resonance excursion prediction 540). The sub-resonance excursion prediction may be further configured compare the predicted excursion to a threshold (e.g., a maximum excursion). When the sub-resonance excursion prediction of the movement of the speaker exceeds a maximum excursion, the adjustable cutoff-frequency of the adjustable-high-pass filter 550 may be raised. When raised, the adjustable-high-pass filter 550 may block the frequencies of the audio signal that were predicted to cause and over excursion. In one possible implementation the sub-resonance excursion prediction 540 computes a difference between the sub-resonance excursion prediction and the maximum excursion as a low-frequency over-excursion. The sub-resonance excursion prediction 540 can then be configured to generate a signal that raises the adjustable cut-off frequency of the adjustable-high-pass filter 550. Various algorithms can be used to determine a relationship between the low-frequency over-excursion and the amount the adjustable cut-off frequency is raised. In one possible implementation, the adjustable cut-off frequency is raised in proportion to the low-frequency over-excursion.

Because transients in the audio signal can cause a speaker to move more than a steady-state tone, the low-frequency excursion protection 500 may be insufficient in eliminating or reducing all over-excursion signals from the audio signal. Accordingly, the HPF version of the audio signal at the output of the low-frequency excursion protection is protected against over-excursions due to transients.

Figure 6:
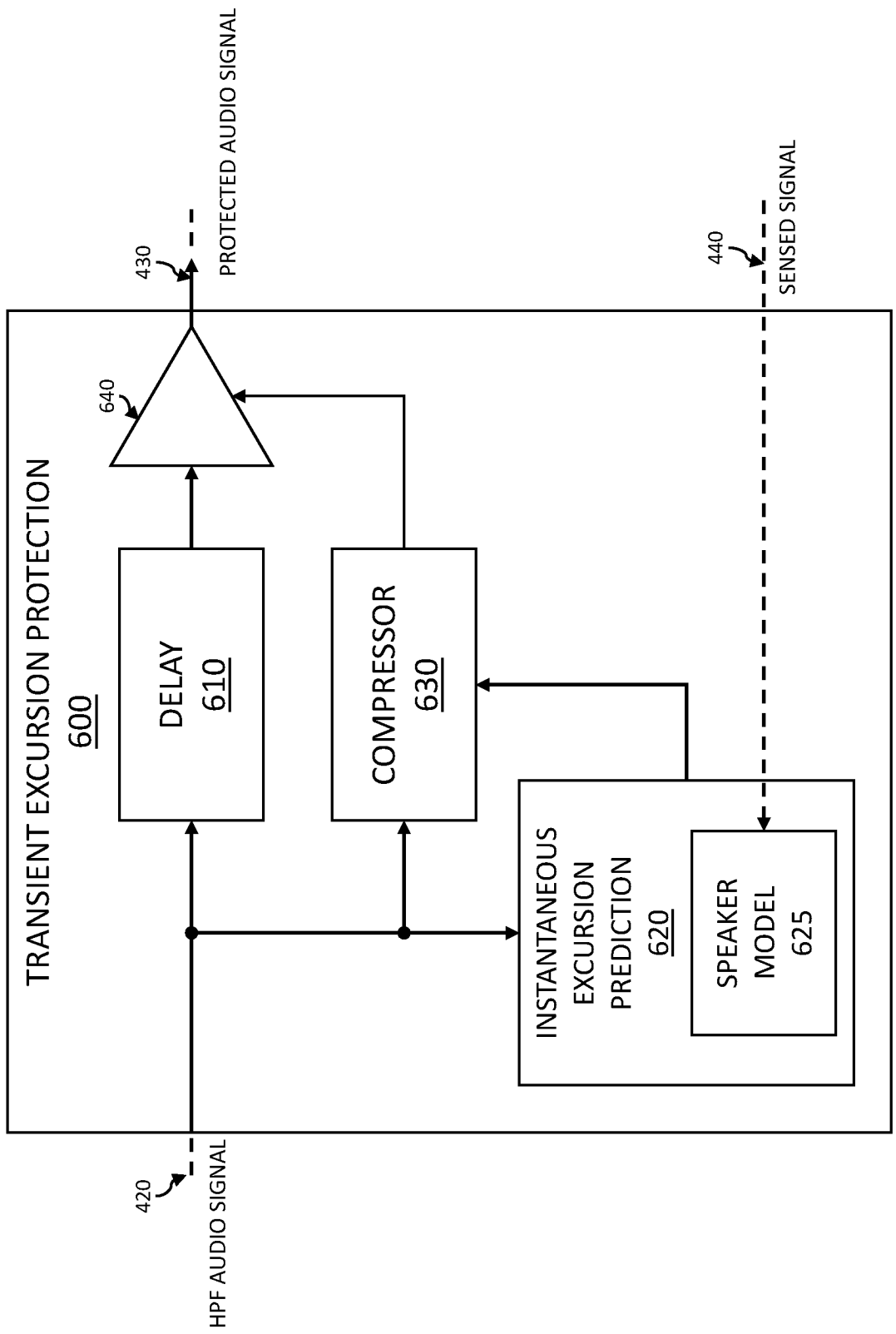
FIG. 6 illustrates a block diagram of a transient excursion protection component of the excursion protection implementation shown in FIG. 4.

FIG. 6 illustrates a block diagram of a transient excursion protection component of the excursion protection implementation shown in FIG. 4. The transient excursion protection 600 includes an amplifier 640 with an adjustable gain. When a transient audio signal is predicted in the received HPF audio signal 420, the adjustable gain of the amplifier 640 can be reduced to decrease and/or limit an excursion caused by the transient audio signal. In other words, the amplifier 640 can operate as a variable attenuator that can attenuate audio signals having a transient.

To prevent a transient audio signal from causing a movement in the speaker with inertia that cannot be slowed or stopped by a change to the adjustable gain, the transient excursion protection includes a delay buffer (i.e., delay 610). The delay provides the transient excursion protection 600 time to adjust the gain of the amplifier 640 before the movement of the speaker reaches an inertia that cannot be overcome with a simple gain adjustment. An advantageous aspect of the disclosed approach is that the delay is not large because the transient excursion protection 600 receives a high-pass filtered version of the audio signal 420. In other words, the size of the delay can correspond to the lowest frequencies of the audio signal received at the input of the transient excursion protection. Because this signal audio signal is high-passed filtered by the previous protection module, the delay can be reduced. Thus, in the disclosed approach the low-frequency excursion protection 500 facilitates a transient excursion protection having a small delay. When the size of the delay 610 is made small, the impact (i.e., affect) of the excursion protection 150 on the digital audio stream that it monitors and adjusts is reduced, which can be advantageous for a variety of reasons including (but not limited to) an invisibility to a user, a compatibility with other audio processing/devices, and the like. While the delay can be made small, it may be sufficiently large so as not to create an audible artifact.

The transient excursion protection 600 includes an instantaneous excursion prediction 620 based on a speaker model 625, in which the speaker parameters of the model are pre-measured (e.g., factory set) or measured on-line (e.g., from a sensor). A variety of speaker models may be implemented, and the disclosed approach is not limited to any particular speaker model. In one possible implementation, the speaker model for the instantaneous excursion prediction may be as shown below.

$$X(n)=d \cdot (a \cdot V(n)+b \cdot X(n-1)+c \cdot X(n-2)) \qquad (6)$$

For equation (6) above, X is speaker displacement, V is the HPF audio signal, n is the current (instantaneous) sample, n−1 is a previous sample, and n−2 is a previous sample. In other words, the instantaneous excursion prediction of the movement of the speaker may be based on the audio signal and previous positions of the speaker. The second-order equation includes constants a, b, c, and d described by speaker parameters, as shown below, where $T_s$ is the sample period.

$$a = T_s^2 \cdot \frac{Bl}{R_e} \quad (7)$$

$$b = R_{ms} \cdot T_s + 2M_{ms} \quad (8)$$

$$c = -M_{ms} \quad (9)$$

$$d = 1/(K_{ms} \cdot T_s^2 + R_{ms} \cdot T_s + M_{ms}) \quad (10)$$

In a possible implementation, the constants, a, b, c, and d can be updated (e.g., periodically, as necessary) based on a sensed signal 440 from the speaker.

A compressor 630 is configured to receive a predicted excursion from the instantaneous excursion prediction 620. The compressor can compare the predicted excursion to a threshold (i.e., a limit). For example, if the predicted excursion is above a (predetermined) maximum excursion then the compressor 630 may generate a signal to control the gain of the adjustable gain amplifier 640 to attenuate the signal out of the delay 610 (i.e., the delayed high-pass filtered version). The amount of attenuation (i.e., a compression ratio) can increase proportionally with a predicted over-excursion. For example, when a predicted over-excursion is 3 decibels (dB) above a maximum excursion, the attenuation applied may be 3 dB. Because the attenuation occurs after the delay 610, a portion of the audio signal prior to the transient is attenuated. This attenuation of the audio signal before the transient reduces a momentum of the speaker prior to the transient. This reduction in momentum helps prevent the transient from adding enough momentum to create an uncontrollable movement.

A maximum excursion (i.e., excursion limit) that is used to trigger excursion protection may have a value that is determined variously. For example, a maximum excursion used for filter adjustment and/or compression adjustment may be derived/measured for a class of speakers or may be derived/measured on a speaker-by-speaker basis. The derivation and/or measurement of the maximum excursion may be performed at a time before implementation (e.g., factory set). In a possible implementation, the maximum excursion may be adjustable (e.g., customer controllable). The adjustability may provide more versatility in protection (e.g., derating) for different classes of expected audio signals.

Figure 7:
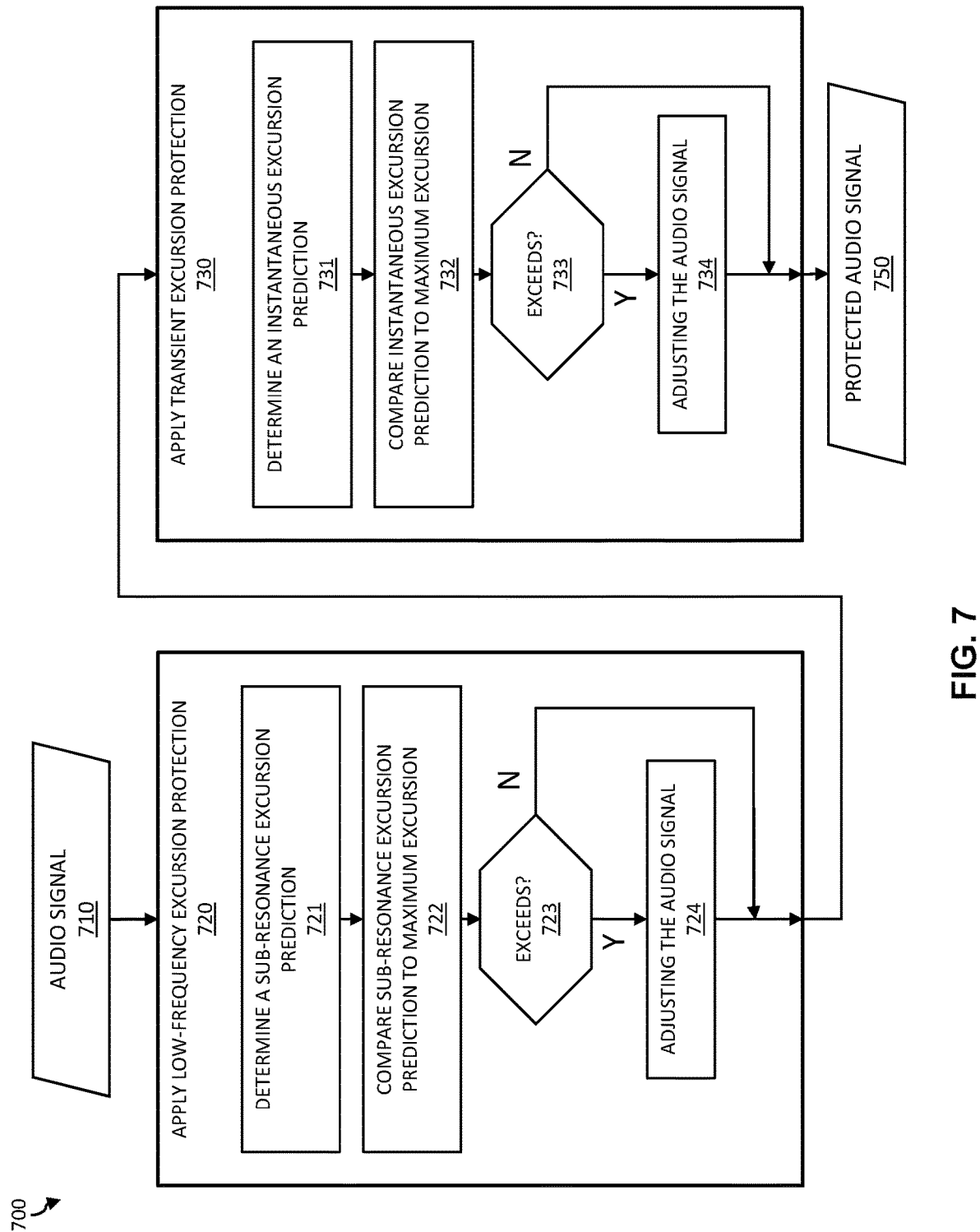
FIG. 7 is a flow chart of a method to limit a movement of a speaker to below a maximum excursion according to a possible implementation of the present disclosure.

FIG. 7 is a flow chart of a method to limit a movement of a speaker to below a maximum excursion according to a possible implementation of the present disclosure. The method 700 includes receiving 710 an audio signal. To limit a movement of a speaker to below a maximum excursion, the method 700 creates a protected audio signal 750 that is analyzed for its potential in driving a speaker to an over excursion and adjusted as necessary to prevent the over excursion. The method first applies 720 a low-frequency excursion protection. The low-frequency excursion protection includes determining 721 a sub-resonance excursion prediction, which can correspond to an amount of excursion of the speaker based on the frequency components of the audio signal below a resonance of the speaker. The sub-resonance excursion prediction is then compared 722 to a maximum excursion. When the prediction exceeds 723 (Y) the maximum excursion (or otherwise satisfies an excursion condition), the audio signal is adjusted (e.g., filtered to remove frequency components). Otherwise (N), the audio signal is not (significantly) adjusted.

After the low-frequency excursion protection, the method 700 applies 730 a transient excursion protection. The transient excursion protection includes determining an instantaneous excursion prediction, which can correspond to an amount of excursion of the speaker based on a current sample and previous sample(s) of the audio signal. The instantaneous excursion prediction is then compared 732 to the maximum excursion. When the prediction exceeds 733 (Y) the maximum excursion (or otherwise satisfies an excursion condition), the audio signal is adjusted (e.g., attenuated, compressed). Otherwise (N), the audio signal is not (significantly) adjusted.

The disclosed approach and its implementations can advantageously provide versatility to a selection of an amplifier for a speaker, or vice versa. For example, the disclosed approach can allow a power amplifier (e.g., a Class-D amplifier) to be connected to a speaker without worry that the speaker cannot handle its full output power. This versatility added may eliminate the need to create multiple amplifier designs to drive a variety of different speakers.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An apparatus, comprising:
a processor configured by software instructions to perform a method including:
receiving an audio signal;
receiving information corresponding to a speaker;
applying a low-frequency excursion protection to the audio signal, the low-frequency excursion protection including a sub-resonance excursion prediction of a movement of the speaker in response to the audio signal based on the information corresponding to the speaker;
applying a transient excursion protection to the audio signal, the transient excursion protection including an instantaneous prediction of the movement of the speaker in response to the audio signal based on the information corresponding to the speaker; and
outputting a protected audio signal including the low-frequency excursion protection and the transient excursion protection.

2. The apparatus according to claim 1, further including a digital to analog converter configured to receive the protected audio signal from the processor and to output a protected analog signal.

3. The apparatus according to claim 2, further including a power amplifier configured to amplify the protected analog signal and to output an amplified protected signal to the speaker, the amplified protected signal having an amplitude below a level that over-drives the speaker.

4. The apparatus according to claim 3, wherein the power amplifier is a Class-D amplifier capable of outputting an amplitude that over-drives the speaker, the Class-D amplifier prevented from outputting the amplitude that over-drives the speaker by the low-frequency excursion protection and the transient excursion protection.

5. The apparatus according to claim 1, wherein the information corresponding to the speaker is received from a sensor proximate to, or integrated with, the speaker.

6. The apparatus according to claim 1, wherein the information corresponding to the speaker includes a position of the speaker or a movement of the speaker.

7. The apparatus according to claim 1, wherein the information corresponding to the speaker includes a driving voltage or a driving current of the speaker.

8. The apparatus according to claim 1, wherein the processor is further configured to derive speaker parameters from the information corresponding to the speaker.

9. The apparatus according to claim 8, wherein the derived speaker parameters are used to create or update a speaker model that describes operation of the speaker, the sub-resonance excursion prediction and the instantaneous prediction of the movement of the speaker based on the speaker model.

10. The apparatus according to claim 1, wherein the apparatus is a smart amplifier and the processor is a digital signal processor.

11. The apparatus according to claim 1, wherein the applying a low-frequency excursion protection to the audio signal includes:
filtering the audio signal to obtain frequencies below a resonant frequency of the speaker;
determining, based on the frequencies below the resonant frequency, that the sub-resonance excursion prediction exceeds a maximum excursion;
raising a cut-off frequency of an adjustable high-pass filter in proportion to an amount that the sub-resonance excursion prediction exceeds the maximum excursion; and
filtering the audio signal using the adjustable high-pass filter to block frequencies of the audio signal below the raised cut-off frequency to prevent an over excursion of the speaker caused by low frequencies.

12. The apparatus according to claim 11, wherein the maximum excursion is adjustable.

13. The apparatus according to claim 1, wherein the applying a transient excursion protection to the audio signal includes:
determining, from the instantaneous prediction of the movement of the speaker in response to the audio signal that a transient audio signal is present; and
attenuating a delayed version of the audio signal to prevent an over excursion of the speaker caused by the transient audio signal.

14. The apparatus according to claim 13, wherein the attenuating a delayed version of the audio signal to reduce a speaker excursion caused by the transient audio signal includes:
reducing a gain of an amplifier while the audio signal is delayed so that the transient audio signal is amplified by the amplifier with the reduced gain.

15. The apparatus according to claim 14, wherein the transient excursion protection is applied after applying the low-frequency excursion protection in order to reduce a delay used for the transient excursion protection.

16. A method to prevent overdriving a speaker, the method including:
receiving an audio signal intended for playback on a speaker;
receiving information corresponding to the speaker;
applying a low-frequency excursion protection to the audio signal, the low-frequency excursion protection including a sub-resonance excursion prediction of a movement of the speaker in response to the audio signal based on the information corresponding to the speaker;
applying a transient excursion protection to the audio signal, the transient excursion protection including an instantaneous prediction of the movement of the speaker in response to the audio signal based on the information corresponding to the speaker; and
outputting a protected audio signal to the speaker, the protected audio signal including the low-frequency excursion protection and the transient excursion protection.

17. The method according to claim 16, wherein the applying a low-frequency excursion protection to the audio signal includes:
filtering the audio signal to obtain frequencies below a resonant frequency of the speaker;
determining, based on the frequencies below the resonant frequency, that the sub-resonance excursion prediction exceeds a maximum excursion;

raising a cut-off frequency of an adjustable high-pass filter in proportion to an amount that the sub-resonance excursion prediction exceeds a maximum excursion; and filtering the audio signal using the adjustable high-pass filter to block frequencies of the audio signal below the raised cut-off frequency to prevent overdriving the speaker.

18. The method according to claim 16, wherein the applying a transient excursion protection to the audio signal includes:

determining from the instantaneous prediction of the movement of the speaker in response to the audio signal that a transient audio signal is present; and attenuating a delayed version of the audio signal to prevent overdriving the speaker.

19. The method according to claim 18, wherein the attenuating a delayed version of the audio signal to reduce a speaker excursion caused by the transient audio signal includes:

reducing a gain of an amplifier while the audio signal is delayed so that a transient audio signal is amplified by the amplifier with the reduced gain.

20. The method according to claim 19, wherein the transient excursion protection is applied after applying the low-frequency excursion protection in order to reduce a delay used for the transient excursion protection.

* * * * *